United States Patent [19]
Hirooka et al.

[11] Patent Number: 5,557,274
[45] Date of Patent: Sep. 17, 1996

[54] AD CONVERTER AND MAGNETIC RECORDING/REGENERATING APPARATUS USING THE SAME

[75] Inventors: Tsuguyoshi Hirooka, Fujisawa; Shoichi Miyazawa; Ryutaro Horita, both of Yokohama; Terumi Takashi, Odawara; Akira Uragami, Sawa-gun, all of Japan

[73] Assignee: Hitachi, Ltd., Tokyo, Japan

[21] Appl. No.: 253,551

[22] Filed: Jun. 3, 1994

[30] Foreign Application Priority Data

Jun. 7, 1993 [JP] Japan .................................. 5-136048

[51] Int. Cl.$^6$ ............................. H03M 1/36; H03M 1/14
[52] U.S. Cl. .......................... 341/155; 341/172; 341/141
[58] Field of Search ................................. 341/155, 141, 341/172

[56] References Cited

U.S. PATENT DOCUMENTS 4,353,057  10/1982  Bernet ..................................... 340/347
4,999,631   3/1991  Sugimoto ............................... 341/156

Primary Examiner—Jeffrey A. Gaffin
Assistant Examiner—Peguy JeanPierre
Attorney, Agent, or Firm—Antonelli, Terry, Stout & Kraus

[57] ABSTRACT

The present invention provides an AD converter which operates at high speed with low power consumption and a magnetic recording/regenerating apparatus using the same. The magnetic recording/regenerating apparatus has a current controller for switching the operating current of the comparator of the AD converter and an ADC controller for receiving an instruction of the conversion speed corresponding to the regenerating frequency. When the current controller receives an instruction for decreasing the conversion speed, it puts an operation state of the AD converter into a low power consumption state.

7 Claims, 12 Drawing Sheets

(1) READ BACK DATA OF CLASSIFICATION A (2) READ BACK DATA OF CLASSIFICATION B (3) READ BACK DATA OF CLASSIFICATION C

FIG. 11

| SIGNAL / CIRCUIT | | REGISTER DATA | CONTROL SIGNAL | | | | SWITCH 19 | OR INPUT | SWITCH 29 |
|---|---|---|---|---|---|---|---|---|---|
| CLASSIFICATION OF OPERATION | | | a1 | a2 | a3 | a4 | | | |
| DURING READ BACK | A (f1) | 11 | 1 | 0 | 0 | 0 | VH | 0 | V (1) |
| | B (f2) | 10 | 0 | 1 | 0 | 0 | = | = | V (2) |
| | C (f3) | 01 | 0 | 0 | 1 | 0 | = | = | V (3) |
| DURING NON-READ BACK | | 00 | 0 | 0 | 0 | 1 | VL | 1 | V (4) |

FIG. 12

| CLASSIFICATION OF OPERATION | SIGNAL / CIRCUIT | REGISTER DATA | CONTROL SIGNAL | | | | SWITCH 19 | SWITCH OR INPUT | SWITCH 34 | SWITCH 37 |
|---|---|---|---|---|---|---|---|---|---|---|
| | | | a1 | a2 | a3 | a4 | | | | |
| DURING READ BACK | A (f1) | 11 | 1 | 0 | 0 | 0 | VH | 0 | ON | R (1) |
| | B (f2) | 10 | 0 | 1 | 0 | 0 | = | = | = | R (2) |
| | C (f3) | 01 | 0 | 0 | 1 | 0 | = | = | = | R (3) |
| DURING NON-READ BACK | | 00 | 0 | 0 | 0 | 1 | VL | 1 | OFF | — |

FIG. 13

| SIGNAL / CIRCUIT / CLASSIFICATION OF OPERATION | | REGISTER DATA | SIGNAL INDICATING REDUCTION OF POWER CONSUMPTION | | | SWITCH CONTROL SIGNAL | | | | ADC42 ~ 45 | | | |
|---|---|---|---|---|---|---|---|---|---|---|---|---|---|
| | | | b1 | b2 | b3 | c,d1 | c,d2 | c,d3 | c,d4 | 42 | 43 | 44 | 45 |
| DURING READ BACK | A (1) | 11 | 1 | 1 | 1 | 1 | 0 | 0 | 0 | ○ | ○ | ○ | ○ |
| | | | | | | 0 | 1 | 0 | 0 | | | | |
| | | | | | | 0 | 0 | 1 | 0 | | | | |
| | | | | | | 0 | 0 | 0 | 1 | | | | |
| | B (2) | 10 | 1 | 1 | 0 | 1 | 0 | 0 | – | ○ | ○ | ○ | × |
| | | | | | | 0 | 1 | 0 | – | | | | |
| | | | | | | 0 | 0 | 1 | – | | | | |
| | C (3) | 01 | 1 | 0 | 0 | 1 | 0 | – | – | ○ | ○ | × | × |
| | | | | | | 0 | 1 | – | – | | | | |
| DURING NON-READ BACK | | 00 | 0 | 0 | 0 | – | – | – | – | × | × | × | × |

○ : ORDINARY OPERATION
× : LOW POWER CONSUMPTION STATE

AD CONVERTER AND MAGNETIC RECORDING/REGENERATING APPARATUS USING THE SAME

BACKGROUND OF THE INVENTION

1. Field of the Invention

The present invention relates to an AD converter for converting an analog signal to a digital signal and a magnetic recording/regenerating apparatus using such AD converter.

2. Description of the Related Art

A high speed AD converter (hereinafter abbreviated to ADC) may be used for a regenerating circuit of a magnetic recording/regenerating apparatus using a constant density recording method. For an ADC used for a magnetic recording/regenerating apparatus of this method, it is necessary to convert data with a different frequency.

Constant density recording is necessary to effectively use a recording medium. For that purpose, as indicated in Japanese Patent Application Laid-Open No. 63-200306, there is a method available for changing the frequency for recording or regenerating according to the recording position. In this method, the magnetic recording density on the outer periphery is generally increased to almost the recording density on the inner periphery, so that the recording frequency for data on the outer periphery is increased.

An example showing an arrangement where an ADC is used for a regenerating circuit of a magnetic recording/regenerating apparatus is indicated in Japanese Patent Application Laid-Open No. 2-182032. The reason is that by converting and regenerating an analog signal on a recording medium corresponding to binary data coded by an RLL code such as (1, 7) code by an ADC, a high magnetic recording density can be obtained.

It is expected that a large capacity magnetic recording/regenerating apparatus can be obtained by using the above two methods together.

To convert and regenerate binary data by an ADC, generally a high speed ADC is necessary. Furthermore, when the method for changing the frequency of a magnetic disk unit for recording or regenerating is used together, the recording frequency for data on the outer periphery becomes high, so that a higher speed ADC is necessary. However, a higher speed ADC requires larger power consumption. Therefore, when a higher speed ADC is used as it is, the power consumption goes up and the recent need of low power consumption cannot be satisfied.

An art for changing the power consumption of an ADC in correspondence with a change in the conversion speed is indicated, for example, in Japanese Patent Application Laid-Open No. 62-204621. However, it is for a low speed integral-type ADC. In the case of a ramp (type) ADC, the conversion level is changed when the integral time is changed and a measure for it becomes an issue. For that purpose, changing the integral capacity of the integrator or changing the current of the constant current source so as to remove the charge from the integral capacity have been proposed. However, reducing the current of a high speed ADC which is not of the integral type has not been proposed.

There is a method for operating a plurality of ADCs in parallel available as an art for realizing a high speed ADC, which is indicated in Japanese Patent Application Laid-Open Nos. 60-183819, 3-70213, and 4-72919.

For the arts described in Japanese Patent Application Laid-Open Nos. 60-183819 and 4-72919 among them, reducing the power consumption is not described. For the art described in Japanese Patent Application Laid-Open No. 3-70213, an arrangement is only described for reduction of the power consumption that an ADC which is not to be used is turned off and no actual realization method is described.

Earlier filed patent applications of the present applicant and related to the present invention, include the Japanese Patent Application Laid-Open Nos. 3-205920 and 3-143116 (U.S. pending patent application Ser. No. 08/177,694) and the Japanese Patent Laid-Open No. 4-124456 (U.S. pending patent application Ser. No. 08/062,770). However, the former serves for operating a phase synchronizing circuit stably, but does not have means for directing a speed to the ADC and means for controlling an operating current for the comparator of the ADC.

The latter discloses means for accurately matching the delay time of a waveform equalizer with a period of the reproduced frequency, but does not have means for receiving the speed direction of the ADC and means for controlling an operating current for the comparator of the ADC.

SUMMARY OF THE INVENTION

An object of the present invention is to provide an ADC in which both high speed AD conversion and low power consumption are realized and a magnetic recording/regenerating apparatus using such ADC.

Another object of the present invention is to provide an ADC system having a plurality of ADCs in which both high speed AD conversion and low power consumption are realized and a magnetic recording/regenerating apparatus using such AD system.

To realize the above first object, the ADC of the present invention has a comparison means for comparing an inputted analog signal with a reference voltage, wherein the operation speed of the above comparison means is decided by the operating current which is controlled by an instruction from the outside of the ADC and flows during operation, an instruction means for instructing one of a plurality of speeds for converting an analog signal to a digital signal, a current control means for controlling the above operating current according to the corresponding speed upon receipt of the above instruction, and a signal generation means for generating a digital signal from the comparison result.

To solve the above second object, the ADC system of the present invention having m ADCs (m≧2) for converting an inputted analog signal to a digital signal has a comparison means for comparing an inputted analog signal with a reference voltage, wherein the operation speed of the above comparison means is decided by the operating current which is controlled from the outside and flows during operation, a reception means for receiving an instruction for instructing one of a plurality of speeds for converting an analog signal to a digital signal, a distribution means for distributing the above analog signal to n ADCs (n≦m) among the above m ADCs in time series according to the above instruction, an output means for receiving digital signals outputted from said n ADCs and outputting them in time series, an ADC control means for suppressing the above operating current of the (m−n) ADCs excluding the above n ADCs upon receipt of the above instruction, and a signal generation means for generating a digital signal from the comparison result.

To increase the conversion speed in the above first constitution, the above current control means operates so as to increase the operating current of the ADC upon receipt of the above instruction. As the flowing current increases, the circuit generally operates at higher speed, so that the ADC can perform high speed AD conversion at this time.

To decrease the conversion speed, the above current control means sets the operating current of the ADC to a small value upon receipt of the above instruction. Since the operating current of the ADC is small at this time, data can be regenerated at low power consumption.

Furthermore, according to the first constitution, a magnetic recording/regenerating apparatus which changes the operation of ADC according to the regenerating frequency can be realized. This apparatus can realize high frequency data conversion by increasing the operating current of the ADC. On the other hand, at a low frequency, the power consumption of the above magnetic recording/regenerating apparatus can be reduced by decreasing the operating current of the ADC.

To increase the conversion speed in the second constitution, the ADC control means increases the number of ADCs in the operation state and connects the input and output destinations to the ADCs in operation sequentially on a time-shared basis upon receipt of the above instruction. Therefore, when the ADC system has m ADCs and each ADC operates at a frequency of f, the ADC system can regenerate at a frequency of m×f.

To decrease the conversion speed, the ADC control means increases the number of ADCs in the low power consumption state upon receipt of the above instruction. The means for switching the input and output destinations connects only between the ADCs in operation sequentially on a time-shared basis. Therefore, when only n ADCs (1≦n<m) among the m ADCs are operated and each of the n ADCs operates at a frequency of f, the ADC system can regenerate n×f frequencies. In this case, the ADC system can regenerate data at lower power consumption as the number of ADCs in operation decreases.

Furthermore, according to the second constitution, a magnetic recording/regenerating apparatus which changes the operation of a plurality of ADCs according to the regenerating frequency can be realized. This apparatus can realize high frequency data conversion by operating a plurality of ADCs in parallel. On the other hand, at a low frequency, the power consumption of the above magnetic recording/regenerating apparatus can be reduced by stopping the operation of a part of the ADCs.

BRIEF DESCRIPTION OF THE DRAWINGS

FIG. 11 is a drawing showing the status of an ADC circuit at each regenerating frequency.

FIG. 12 is a drawing showing the operation of an ADC current controller at each regenerating frequency.

FIG. 13 is a drawing showing a control signal at each regenerating frequency and the operation status of a plurality of ADCs.

DETAILED DESCRIPTION OF THE PREFERRED EMBODIMENTS

Next, the embodiments of the present invention will be explained with reference to the accompanying drawings.

Firstly, the embodiments for accomplishing the first object will be explained with reference to FIGS. 1 to 4, 11, and 12.

Figure 1:
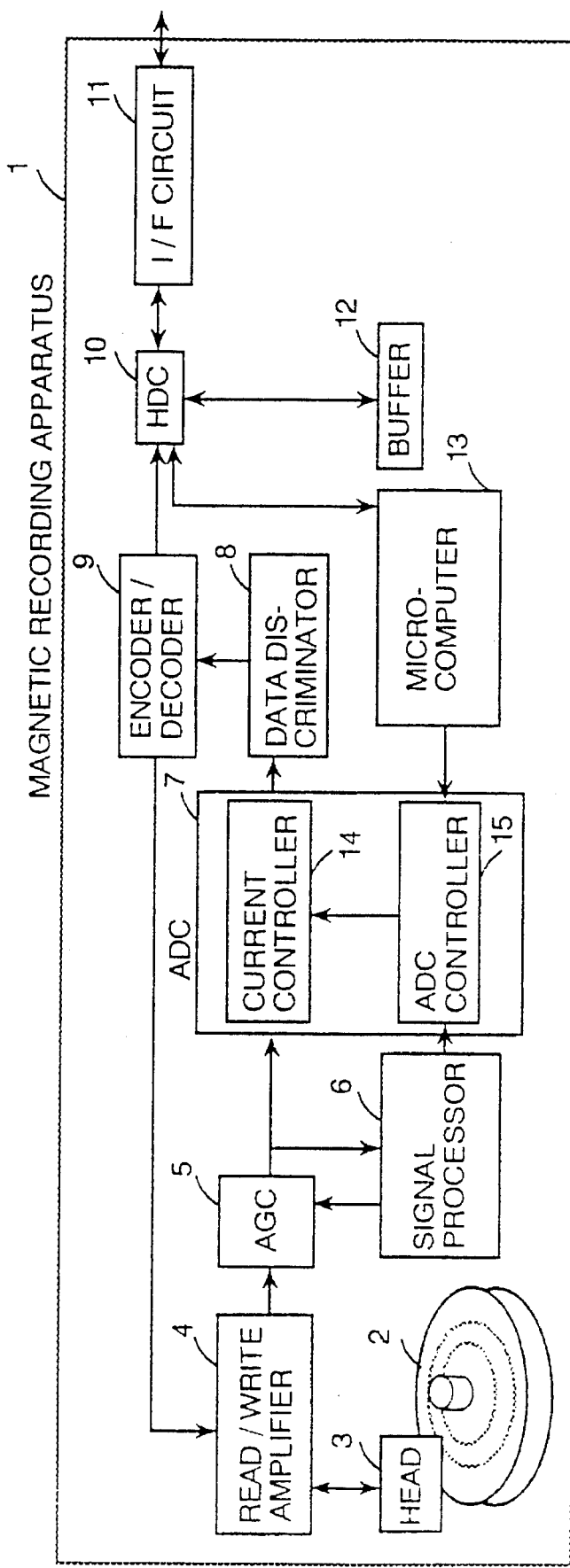
FIG. 1 is a block diagram of the first embodiment of the present invention.

FIG. 1 is a block diagram of a magnetic recording/regenerating apparatus using the present invention. The magnetic recording/regenerating apparatus comprises of a recording medium 2, a head 3, a read/write amplifier 4, an AGC 5, a signal processor 6, an ADC 7, a data discriminator 8, an encoder/decoder 9, an HDC 10, an I/F circuit 11, a buffer 12, and a microcomputer 13. The ADC 7 contains a current controller 14 and an ADC controller (reception means) 15 for controlling the above current controller 14 by an instruction from the microcomputer 13.

Figure 2:
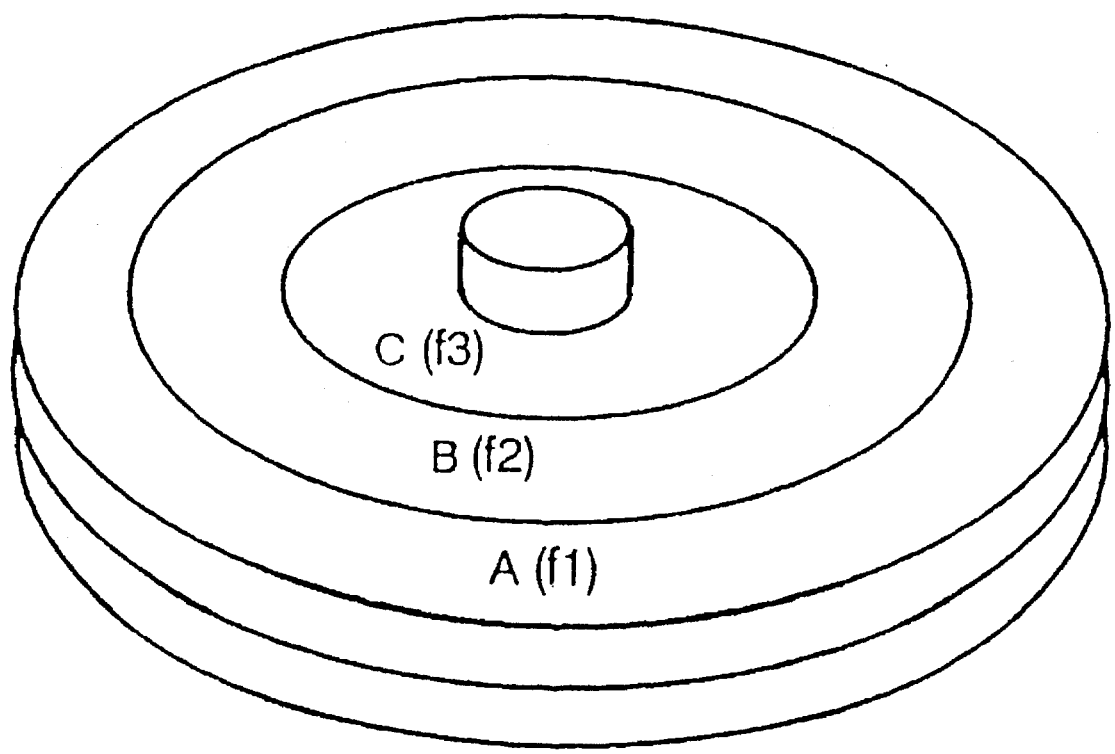
FIG. 2 is an illustration showing the classification of recording/regenerating frequencies of a magnetic recording medium.

FIG. 2 shows a classification example of recording/regenerating frequencies of the magnetic recording medium 2. In this case, the medium is divided into three classifications by frequency. Assuming that the classifications are A, B, and C sequentially from the outer periphery, the data in classification A is regenerated at a frequency of f1, the data in classification B at a frequency of f2, and the data in classification C at a frequency of f3. It is assumed that the frequency in the classification near the outer periphery is higher than that in the classification far from the outer periphery such as, for example:

$$f1:f2:f3=4:3:2 \qquad \text{Expression 1}$$

Figure 3:
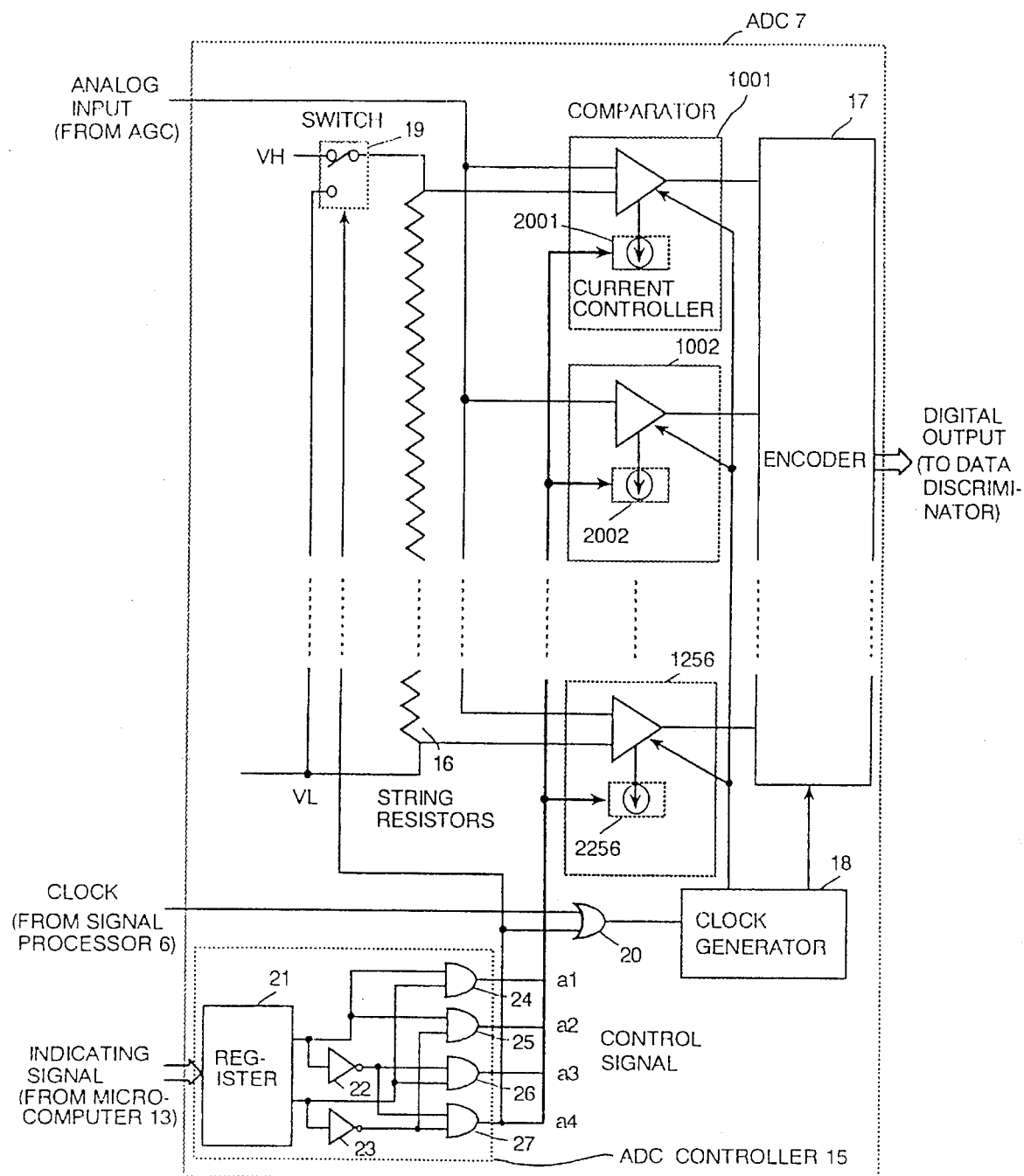
FIG. 3 is a block diagram of an ADC.

FIG. 3 is a block diagram of the above ADC 7. In this embodiment, the ADC 7 is a 8-bit flash type ADC. The ADC 7 comprises of the above ADC controller 15, string resistors 16, an encoder 17 which is a signal generation means, a clock generator 18, a switch 19, an OR gate 20, and 256 comparators (comparison means) 1001 to 1256. The comparators 1001 to 1256 contain current controllers 2001 to 2256 respectively so as to change the operating current of a differential amplifier of each comparator. The 256 current controllers 2001 to 2256 are equivalent to the current controller 14 shown in FIG. 1. The current controllers 2001 to 2256 switch currents according to control signals a1 to a4 from the ADC controller 15. Furthermore, the ADC controller 15 controls the switch 19 and the OR gate 20 so as to realize low power consumption. The switch 19 switches the voltage to be supplied to the string resistors 16 from VH to VL according to control signals from the ADC controller 15 and the OR gate 20 fixes the clock. The ADC controller 15 decodes data which is written into a register 21 from the microcomputer 13 using inverters 22 and 23 and AND gates 24 to 27 and generates the above control signals a1 to a4 to the circuits. In this embodiment, a clock in proportion to the regenerating frequency is inputted from the signal processor 6 as an operation clock of the ADC.

Figure 4:
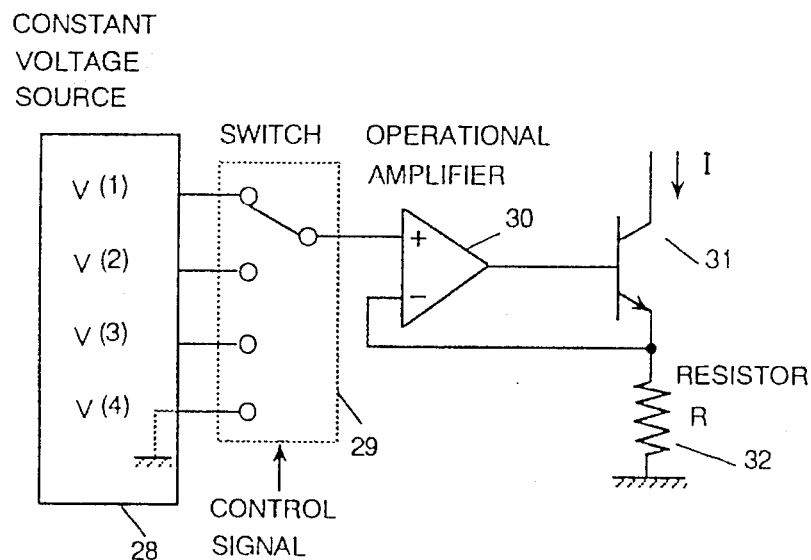
FIG. 4 is a block diagram of a current controller.

FIG. 4 shows a configuration example of the current controller 2001. The current controller 2001 comprises of a constant voltage source 28, a switch 29, an operational amplifier 30, a transistor 31, and a resistor 32. The switch 29 is operated by a control signal from the ADC controller 15 and supplies one of voltages V(1) to V(4) to the input terminal of the operational amplifier 30. In this case, V(1)>V(2)>V(3)>V(4)=0 and it is assumed, for example, that the following relation is held.

$$V(1):V(2):V(3)=4:3:2 \qquad \text{Expression 2}$$

The full current of the comparator 1001 is a value in proportion to the current I flowing through the above circuit by a current mirror. The magnitude of operating current I can be expressed roughly by the following expression.

$$I=V(k)/R, \; k=1 \text{ to } 4 \qquad \text{Expression 3}$$

As shown in Expression 3, when the highest voltage V(1) is supplied, the largest current flows. The comparator 1001 operates at higher speed as the flowing current increases, so that it operates at the highest speed when the voltage V(1) is supplied. As the voltage is lowered to V(2) and V(3) sequentially, the current decreases and the operation speed becomes slower. When V(4) is supplied, little current flows and the comparator will not function. It is assumed that the current controllers 2002 to 2256 of the comparators 1002 to 1256 have the same constitution.

FIG. 11 shows the status of the ADC circuit at each regenerating frequency.

The microcomputer 13 receives a read command which is written into the I/F circuit 11 from the host computer via the HDC 10. The microcomputer 13 analyzes it and obtains the reading position on the magnetic recording medium 2 and furthermore obtains the regenerating frequency in one of the classifications A to C shown in FIG. 2 using the classification according to the reading position.

The microcomputer 13 writes different data in the register of the ADC controller 15 according to the regenerating frequency and the circuit inside the ADC operates according to the data as shown in FIG. 11. The operation of this embodiment will be explained hereunder with reference to this drawing and FIGS. 1 to 4.

Firstly, reading back of data contained in the classification A will be explained. The microcomputer 13 transfers a register value "11" for instructing reading back of data in the classification A to the ADC controller 15. The ADC controller 15 decodes the above data and generates control signals a1 to a4. In this case, control signal a1=1 and a2 to a4=0. According to the above control signals, the input signal to the OR gate 20 becomes 0, and the switch 19 is changed to VH, and the switch 29 is changed to V(1). Since V(1) is inputted to the operational amplifier 30, the current of each comparator is maximized and each comparator operates at the highest speed.

As a result, each comparator can operate in correspondence with the encoder 17 in which the clock corresponding to the regenerating frequency is inputted. The ADC 7 operates at high speed and can read data.

Next, reading back of data contained in the classification B will be explained. In the same way as with the above mentioned, the ADC controller 15 generates control signals a1 to a4. By the above control signals, the input signal to the OR gate 20 becomes 0, and the switch 19 is connected to VH, and the switch 29 is connected to V(2). The operating current at this time becomes smaller such as about 75% of that at the time of reading back of data in the classification A as simply calculated from Expressions 2 and 3 and the power consumption can be reduced in correspondence with it. Although the operation speed of each comparator becomes slow, no time lag occurs because also the regenerating frequency becomes slow. Data is read back in the same way hereinafter.

To read back data contained in the classification C third, the switch 29 is connected to V(3) and the others are the same as above as shown in FIG. 11. The operating current at this time is smaller such as about 50% of the maximum current and the power consumption is lower. Although the operation speed of each comparator is also slow, there is no problem because the ADC operates at higher speed than the regenerating frequency f3 of the classification C.

Finally, a case that no data is read back will be explained. The switch 29 is connected to V(4) and the switch 19 is connected to VL as shown in FIG. 11. At this time, the currents flowing through the comparators 1001 to 1256 and the resistor 16 are almost 0. When the input signal to the OR gate 20 is set to 1 at the same time, the clock is fixed and the power consumption becomes extremely low.

According to this embodiment, by changing the bias voltage of the current source of each comparator, the magnitude of current is changed and the operation speed of each comparator corresponding to the regenerating frequency is realized by this change in current. By doing this, reading back of data at a high frequency is realized and reading back of data at a low frequency is performed at a low current and the power consumption can be suppressed.

Next, the current controller will be explained using an embodiment in which a circuit with a different constitution from that of the aforementioned embodiment is used.

Figure 5:
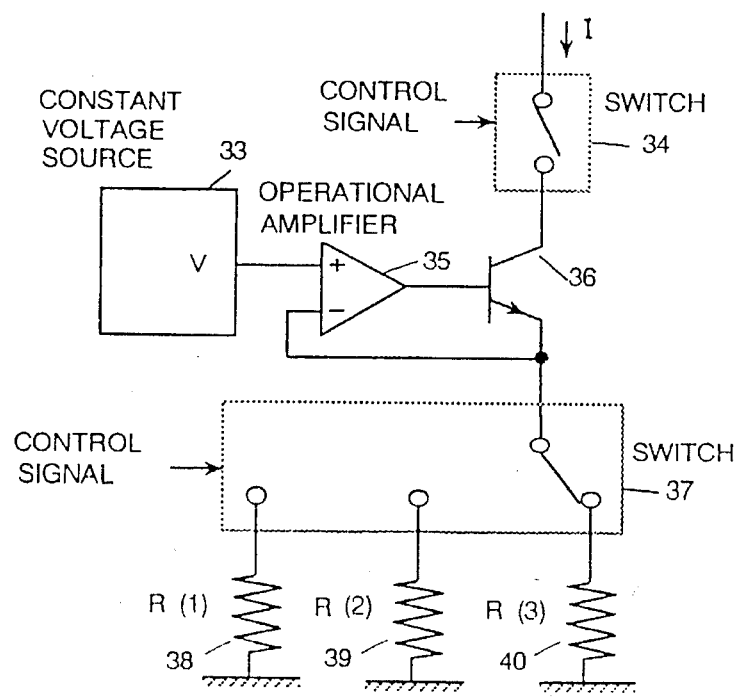
FIG. 5 is another block diagram of a current controller.

FIG. 5 shows another configuration example of the current controller 2001. The circuit shown in FIG. 5 uses a plurality of resistors 38 to 40. Control signals a1 to a4 switch the resistor connected by a switch 37 according to the frequency at the time of reading back of data. When it is assumed that:

$$R1:R2:R3=3:4:6 \qquad \text{Expression 4}$$

and the switch 37 is connected to R1, R2, and R3 in the descending order of frequency, the current reduces at the same rate as that in the aforementioned embodiment. When no data is read back, the control signal turns a switch 34 off and cuts off the current path so as to prevent the current from flowing. The current controllers 2002 to 2256 have the same constitution.

FIG. 12 shows the operation of a current controller when this embodiment is used.

A difference of this embodiment from the aforementioned embodiment is that the bias voltage switching function in the first embodiment is realized by changing the resistor and cutting off the current path. Namely, in the aforementioned embodiment, four bias voltages are switched by the switch 29 for four cases in total such as three frequencies when data is read back and a case when no data is read back. On the other hand, in this embodiment, three resistors are switched by the switch 37 for three frequencies when data is read back and the current path is cut off by the switch 34 when no data is read back. In this embodiment, generation of control signals and operations of the switches except the above are the same as those in the aforementioned embodiment. This embodiment obtains the same good results in the power consumption and conversion speed as those in the aforementioned embodiment.

A parallel type ADC is used in the above two embodiments. However, an ADC of another type may be used. The number of recording classifications on a magnetic recording medium and the ADC current switching count may be optional.

Next, the embodiment for accomplishing the second object of the present invention will be explained with reference to FIGS. 2, 6 to 10, and 13.

Figure 6:
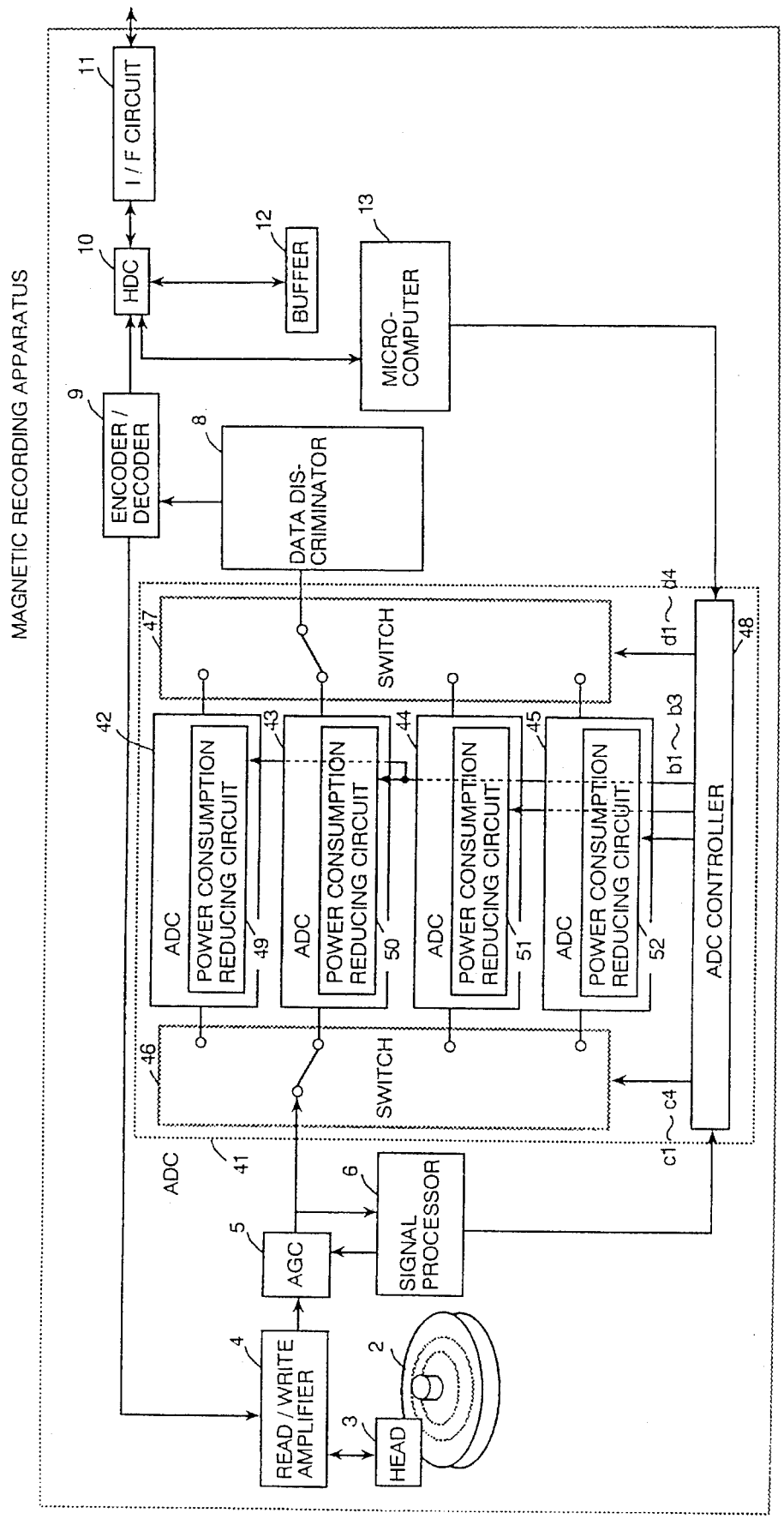
FIG. 6 is a block diagram of the second embodiment of the present invention.

FIG. 6 is the same as FIG. 1 except an ADC 41. The ADC 41 consists of ADCs 42 to 45, a switch (distribution means) 46 for connecting output of the AGC 5 to the input terminals of the ADCs 42 to 45, a switch (output means) 47 for connecting output of the ADCs 42 to 45 to the input terminal of the data discriminator 8, and an ADC controller 48 for controlling the ADCs 42 to 45 and the switches 46 and 47 by an instruction from the microcomputer 13. The ADCs 42 to 45 contain power consumption reducing circuits 49 to 52 respectively. The ADC controller 48 operates n ($0 \leq n \leq 4$) ADCs among the four ADCs 42 to 45 according to the regenerating frequency and puts the other ADCs into the low power consumption state. The ADC controller 48 connects the ADCs in the operation state sequentially by the switches 46 and 47 so as to output and input data and converts it from analog to digital. The frequency classification of the magnetic recording medium 2 is the same as that shown in FIG. 2.

Figure 7:
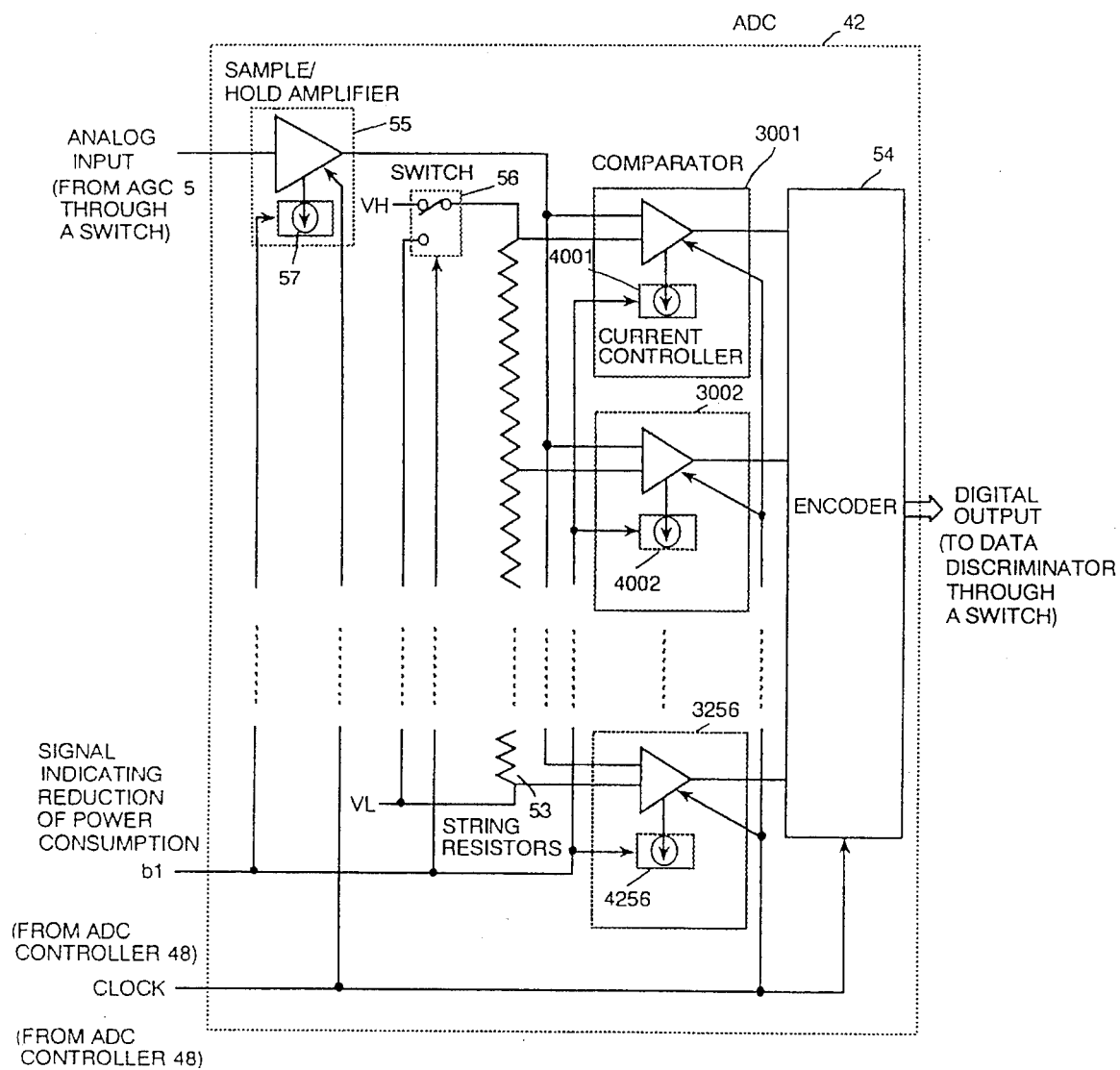
FIG. 7 is a block diagram of an ADC of the second embodiment.

FIG. 7 is an inner block diagram of the ADC 42. In this case, the ADC 42 is a 8-bit parallel type ADC. The ADC 42 contains a resistor string 53, an encoder 54, a sample/hold amplifier 55, a switch 56, and 256 comparators 3001 to 3256. The sample/hold amplifier 55 contains a current controller 57, and the comparators 3001 to 3256 contain current controllers 4001 to 4256, and the operating currents may be reduced to almost 0 by these circuits. The switch 56 and the current controllers 57 and 4001 to 4256 are equivalent to the power consumption reducing circuit 49 shown in FIG. 6 and they form a circuit for realizing reduction of power consumption of the ADC 42. This circuit is operated according to a signal indicating reduction of power consumption b1 from the ADC controller 48 which will be described later. The switch 56 switches the voltage to be supplied to the resistor string 53 so as to reduce the current flowing through the resistor string. The current controllers 57 and 4001 to 4256 switch the inner bias voltages so as to change the currents of the sample/hold amplifier 55 and the comparators 3001 to 3256.

The ADCs 43 to 45 have the same constitution as that of the ADC 42.

Figure 8:
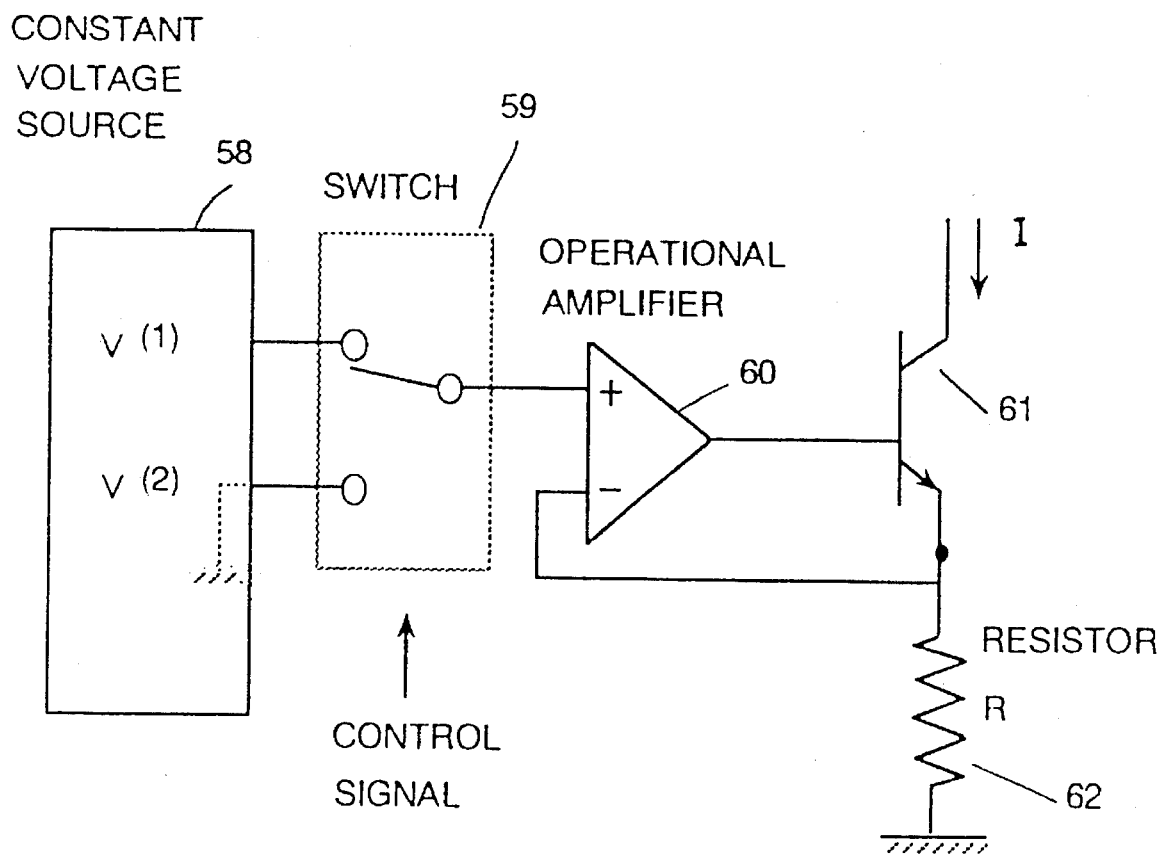
FIG. 8 is a block diagram of a current controller.

FIG. 8 shows a configuration example of the current controller 4001. This circuit consists of a constant voltage source 58, a switch 59, an operational amplifier 60, a transistor 61, and a resistor 62 and has a function for turning the operating current of the comparator 3001 on or off. The switch is changed according to a control signal from the ADC controller 48 and the current is reduced to almost 0 when the input terminal of the operational amplifier 60 is connected to voltage V(2)=0. The current controllers 57 and 4002 to 4256 have the same constitution as that of the current controller 4001. However, the voltage and resistance of the current controller 57 do not always match the values of the current controllers 4001 to 4256.

Figure 9:
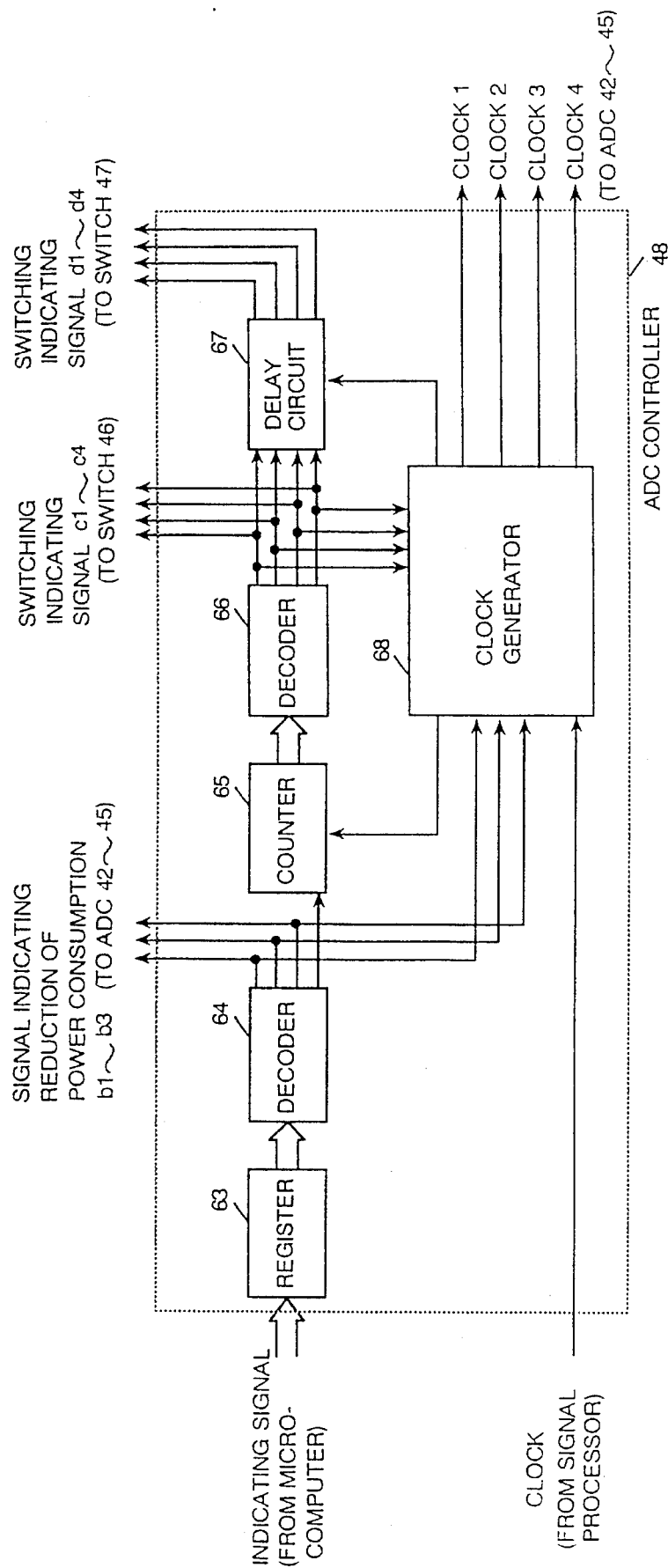
FIG. 9 is a block diagram of an ADC controller.

FIG. 9 is an inner block diagram of the ADC controller 48. The circuit consists of a register 63 for latching data from the microcomputer 13, a decoder 64 for generating signals indicating reduction of power consumption b1 to b3 to the ADCs 42 to 45 and a control signal of a counter 65 on the basis of the above data, a counter 65 for counting the order for switching the switches 46 and 47, a decoder 66 for generating control signals c1 to c4 of the switch 46 from the value of the counter, a delay circuit 67 for generating control signals d1 to d4 of the switch 47 by delaying the control signals of the switch 46 by the ADC conversion time, and a clock generator 68 for generating operation clocks of the ADCs 42 to 45, the counter 65, and the delay circuit 67 from the clock of the signal processor 6.

FIG. 13 shows control signals at each regenerating frequency and the ADC operation circuit. The ADC system operates many ADCs in parallel when the regenerating frequency is high and performs high speed conversion, and puts all the ADCs into the low power consumption state when no data is read back. The switches 46 and 47 are switched sequentially between the ADCs in operation by the control signals c1 to c4 and d1 to d4.

Figure 10:
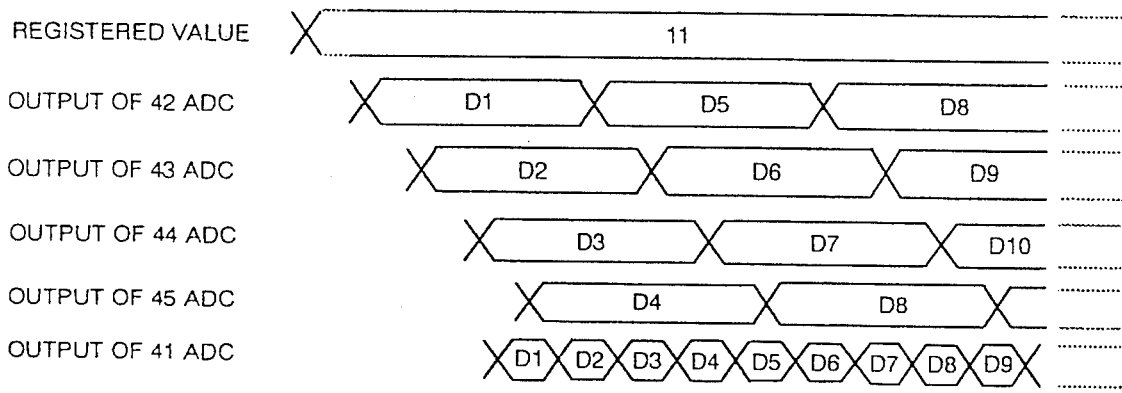
FIG. 10 is a timing chart of data output of an ADC.
Figure 10:
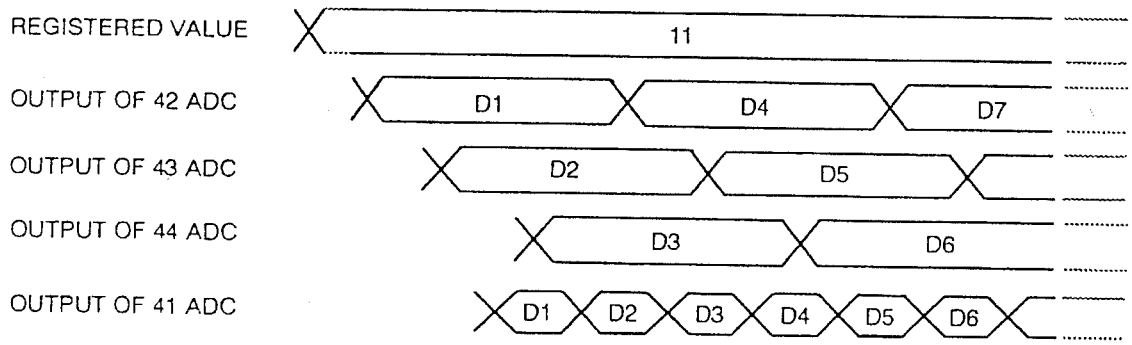
Figure 10:
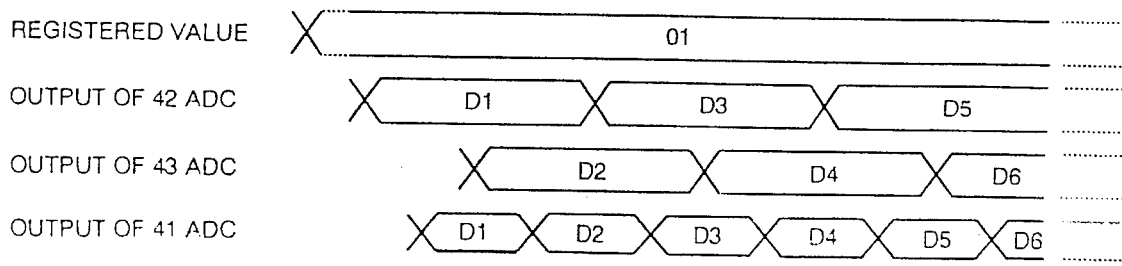

FIG. 10 shows the situation of data output of the ADC in each classification. In the classification A, the microcomputer 13 writes "11" as register data. The four ADCs 42 to 45 operate in parallel and an output result corresponding to a high speed frequency is obtained. In the classifications B and C, low speed conversion is acceptable, so that the number of operating ADCs is reduced.

The operation of this embodiment will be explained hereunder with reference to FIGS. 2, 6 to 10, and 13.

The operation up to the step that the microcomputer 13 obtains the regenerating position on the magnetic recording medium 2 and the regenerating frequency according to the read command from the host computer is the same as that in the first embodiment.

Firstly, reading back of data contained in the classification A will be explained. When the ADC controller 48 receives data from the microcomputer 13, the inner decoder 64 generates signals indicating reduction of power consumption b1 to b3 and control signals b1 to b4 of the counter 65. Since b1=b2=b3=1 in this case, the ADCs 42 to 45 perform the general operation. In the ADC controller 48 in the initial state, the control signals c1 and d1 are set at 1 and the switches 46 and 47 are connected to the ADC 42. Thereafter, data is read from the magnetic recording medium 2 via the head 3 by the read/write amplifier 4. When the data is inputted into the ADC 42 from the AGC 5 via the switch 46, the sample/hold amplifier 42 of the ADC 42 samples and holds the data. On the other hand, the counter 65 of the ADC controller 48 performs a counting operation, and the control signal c2 outputted from the decoder 66 is set to 1 at the next timing, and the control signals c1 to c4 switch the switch 46 so as to connect to the ADC 43. In the same way, the control signals c1 to c4 switch the switch 46 to the ADC 44, ADC 45, ADC 42, ADC 43, —sequentially. On the other hand, the switch 47 is switched in the same way by the control signals d1 to d4 which are obtained by delaying the control signals c1 to c4 of the switch 46 by the conversion time of the ADCs 42 to 45 by the delay circuit 67. By doing this, the control signals c1 to c4 and d1 to d4 operate the four ADCs in parallel and switch the switches so as to transmit and receive data. As a result, the entire ADCs can realize a conversion speed which is four times of that of one ADC as shown in FIG. 10.

Next, reading back of data contained in the classification B will be explained. The ADC controller 48 decodes an indicating signal from the microcomputer 13 in the same way as with the aforementioned and generates control signals b1 to b3. Since b1=b2=1 and b3=0 in this case, the ADCs 42 to 44 perform the general operation, though the ADC 45 enters the low power consumption state. Namely, in the ADC 45, the operation clock is fixed and the bias voltage of the current source is reduced to 0 V by the power consumption reducing circuit 52. On the other hand, the switch 46 is connected to the ADC 42 in the initial state and the ADCs 42 to 44 excluding the ADC 45 are switched by the control signals c1 to c3 every data. The control signal c4 for instructing to connect the switch 46 to the ADC 45 in the low power consumption state is fixed to 0. The switch 47 performs the same operation by delaying the switching timing by the ADC conversion time against that of the switch 46. By doing this, as shown in FIG. 10(2), data is read back at an ADC frequency of 3×f. Since the ADC controller 48 keeps the ADC 45 in the low power consumption state in this case, the power consumption is reduced by that amount and the power consumption of the entire ADC 41 is reduced to about 75%.

Reading back of data contained in the classification C will be explained third. The ADC controller 48 generates control signals b1 to b3 according to an indicating signal from the microcomputer 13 in the same way as with the aforementioned. In this case, b1=1 and b2=b3=0. Therefore, the ADCs 42 and 43 perform the general operation and the ADCs 44 and 45 are put into the low power consumption state by the power consumption reducing circuits 51 and 52. On the other hand, the switches 46 and 47 switch the ADCs 42 and 43 alternately so as to connect and the control signals c3, c4, d3, and d4 are fixed to 0 at this time. By doing this, the ADC system 41 reads back data at an ADC frequency of 2×f and the power consumption at this time is about 50% of that at the time of reading back of data in the classification A.

Finally, when no data is read back, according to an indicating signal from the microcomputer 13, the ADC controller 48 sets b1=b2=b3=0 and puts all the ADCs 42 to 45 into the low power consumption state.

This embodiment provides ADCs contained in a magnetic recording/regenerating apparatus which are suited to reading back of data at different frequencies by installing four ADCs, two switches, a power consumption reducing circuit contained in each ADC, and an ADC controller. Particularly, reading back of data at a high frequency can be realized by operating a plurality of ADCs on a time-shared basis and the power consumption can be reduced by stopping a part of the ADCs during reading back of data at a low frequency.

Four ADCs are used in the above embodiment. However, the number of ADCs is optional and the number of recording classifications on a magnetic recording medium is also optional. Furthermore, as a power consumption reducing method, a method for cutting off the power source may be used or only the clock stopping method or the current controller current reducing method may be used. A parallel type ADC is used in this embodiment. However, an ADC of another type may be used.

A combination of the first and second embodiments may be used.

Since the frequency on the outermost periphery is generally about two times of the frequency on the innermost periphery, even if any constitution of the present invention is used, the power consumption of ADC during reading back of data can be reduced by about 25%.

What is claimed is:

1. An AD converter comprising:

a comparison means for comparing an inputted analog signal with a reference voltage, wherein an operation speed of said comparison means is controlled by an operating current (dissipation current) supplied thereto;

an indication means for receiving an indication for setting a conversion speed for converting an analog signal to a digital signal, said indication indicating at least one of a conversion speed and a supply current;

a current control means for supplying said operating current to said comparison means at a level controlled by said indication means, to set an operating speed of said comparison means to said conversion speed based upon said indication;

a signal generation means for generating a digital signal based upon a comparison result obtained by said comparison means.

2. An AD converter according to claim 1, wherein said comparison means has a differential amplifier and said operating current is an operation current flowing through said differential amplifier.

3. An AD converter system comprising:

m AD converters (m≧2) for converting an inputted analog signal to a digital signal, wherein each of said AD converters has comparison means for comparing an inputted analog signal with a reference voltage, wherein an operating speed of said comparison means is controlled by an operating current supplied thereto;

an instruction means for outputting an instruction for instructing one of a plurality of speeds for converting an analog signal to a digital signal;

a distribution means for distributing said analog signal to n AD converters (n≦m) among said m AD converters in time series according to said instruction;

art output means for receiving digital signals outputted from said n AD converters and outputting said digital signals in time series;

art AD converter control means for suppressing said operating current of (m-n) AD converters excluded from said n AD converters upon receipt of said instruction; and a signal generation means for generating a digital signal from a comparison result from said comparison means.

4. A reproducing apparatus for reproducing a signal at different frequencies depending on a reproducing position on a recording medium and for converting an analog signal read from said recording medium to a digital signal said apparatus, comprising:

an AD convertor;

a comparison means in said AD converter, for comparing an inputted analog signal with a reference voltage, wherein an operating speed of said comparison means is controlled by an operating current supplied thereto;

an instruction means for outputting an instruction for instructing one of a plurality of speeds for converting an analog signal to a digital signal in correspondence with a frequency dependent upon said reproducing position on said recording medium;

a current control means for controlling said operating current supplied to said comparison means at a level controlled by said instruction, to set said operating speed of said comparison means; and signal a generation means for generating a digital signal from a comparison result from said comparison means.

5. A reproducing apparatus for reproducing a signal at different frequencies depending on a reproducing position on a recording medium and for converting an analog signal read from said recording medium to a digital signal, said apparatus comprising:

m (m≧2) AD converters;

a comparison means in each of said AD converters, for comparing an inputted analog signal with a reference voltage, wherein an operating speed of said comparison means is controlled by art operating current supplied thereto;

art instruction means for outputting an instruction for instructing one of a plurality of speeds for converting an analog signal to a digital signal;

a distribution means for distributing said analog signal to n AD converters (n≦m) among said m AD converters in time series according to said instruction;

an output means for receiving digital signals outputted from said n AD converters and outputting said digital signals in time series;

an AD converter control means for suppressing said operating current of (m-n) AD converters excluded from said n AD converters upon receipt of said instruction; and a signal generation means for generating a digital signal from a comparison result from said comparison means.

6. A reproducing apparatus according to claim 4 wherein said comparison means has a differential amplifier and said operating current is an operation current flowing through said differential amplifier.

7. A reproducing apparatus according to claim 5 wherein said comparison means has a differential amplifier and said operating current is an operation current flowing through said differential amplifier.

* * * * *